US011145580B1

(12) United States Patent
Libsch et al.

(10) Patent No.: US 11,145,580 B1
(45) Date of Patent: Oct. 12, 2021

(54) IOT AND AI SYSTEM PACKAGE WITH SOLID-STATE BATTERY ENHANCED PERFORMANCE

(71) Applicant: INTERNATIONAL BUSINESS MACHINES CORPORATION, Armonk, NY (US)

(72) Inventors: Frank Robert Libsch, White Plains, NY (US); Stephen W. Bedell, Wappingers Falls, NY (US); Ning Li, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/830,197

(22) Filed: Mar. 25, 2020

(51) Int. Cl.
H01L 23/58 (2006.01)
H01L 23/495 (2006.01)
H01L 23/00 (2006.01)
H01L 25/00 (2006.01)
H01L 23/31 (2006.01)

(52) U.S. Cl.
CPC .... H01L 23/49593 (2013.01); H01L 23/3107 (2013.01); H01L 24/81 (2013.01); H01L 25/50 (2013.01)

(58) Field of Classification Search
CPC .............. H01L 23/58; H01L 23/49593; H01L 23/3107; H01L 24/81
See application file for complete search history.

(56) References Cited

U.S. PATENT DOCUMENTS

| 8,761,842 | B2 | 6/2014 | Jacobs |  |
|---|---|---|---|---|
| 9,935,088 | B2 | 4/2018 | Budd et al. |  |
| 10,317,938 | B2 | 6/2019 | Goh et al. |  |
| 2001/0033952 | A1* | 10/2001 | Jenson | H01M 6/188 429/7 |
| 2003/0015728 | A1 | 1/2003 | Bosco et al. |  |
| 2007/0220272 | A1 | 9/2007 | Campisi et al. |  |
| 2013/0207548 | A1 | 8/2013 | Leshniak |  |
| 2017/0092994 | A1* | 3/2017 | Canfield | H01M 10/48 |
| 2017/0249493 | A1* | 8/2017 | Yu | H01L 21/56 |
| 2018/0198159 | A1* | 7/2018 | Azami | H01M 10/0525 |
| 2018/0308799 | A1 | 10/2018 | Dalal et al. |  |
| 2019/0206798 | A1 | 7/2019 | Collins et al. |  |
| 2019/0252924 | A1 | 8/2019 | Bito et al. |  |

(Continued)

FOREIGN PATENT DOCUMENTS

CN 109407125 A 3/2019

OTHER PUBLICATIONS

List of IBM Patents or Patent Applications Treated As Related, 2 pgs.

(Continued)

*Primary Examiner* — Errol V Fernandes
(74) *Attorney, Agent, or Firm* — Intelletek Law Group, PLLC; Gabriel Daniel, Esq.

(57) ABSTRACT

An energy storage device for an integrated circuit carrier package. One or more energy storage elements have contact elements arranged thereon that include an anode, a cathode, and an isolated common pad. The energy storage element is configured for arrangement in a stack of energy storage elements in which the isolated common pad is shorted to one of the anode or the cathode by bonded conductive interconnects.

20 Claims, 21 Drawing Sheets

(56) References Cited

U.S. PATENT DOCUMENTS

2019/0261470 A1 8/2019 Wang
2019/0287208 A1 9/2019 Yerli
2020/0065278 A1 2/2020 Lukas et al.
2020/0105705 A1 4/2020 Cheng et al.

OTHER PUBLICATIONS

Chen, W. et al., "Development of Novel Fine Line 2.1 D Package with Organic Interposer Using Advanced Substrate-Based Process"; IEEE 68th Electronic Components and Technology Conference (2018); 6 pgs.
Islam, N. et al., "High Density Ultra-Thin Organic Substrates for Advanced Flip Chip Packages"; IEEE 69th Electronic Components and Technology Conference (2019); 5 pgs.
La Rosa, R. et al., "Strategies and Techniques for Powering Wireless Sensor Nodes through Energy Harvesting and Wireless Power Transfer"; Sensors (2019); vol. 19:2660; 16 pgs.

\* cited by examiner

1700

IOT AND AI SYSTEM PACKAGE WITH SOLID-STATE BATTERY ENHANCED PERFORMANCE

BACKGROUND

Technical Field

The present disclosure generally relates to enhanced performance smart devices that may not be connected to a tethered power supply. More particularly, the present disclosure relates to enhanced performance smart devices that operate with solid-state batteries and/or super-capacitors (supercaps).

Description of the Related Art

Today, there are an increasing number of enhanced performance smart electronic devices having sensors that may not be connected to a tethered power supply. For example, smart devices that are part of an Internet of Things (IoT) network, and/or an Artificial Intelligence (AI) system package may be microscopic in size and remotely located from a base system.

SUMMARY

According to various embodiments, an IoT and AI System package with a solid-state battery enhanced performance, and a method of manufacture are disclosed herein.

In one embodiment, an energy storage device includes one or more aligned and bonded energy storage elements. Each of the energy storage elements has contact elements arranged thereon include an anode, a cathode, and an isolated common pad. The plurality of energy storage elements are configured for arrangement in a stack in which the isolated common pad is shorted to one of the anode or the cathode by bonded conductive interconnects.

In an embodiment, the bonded conductive interconnects is a controlled collapse chip connection (C4) bond.

In an embodiment, the bonded conductive interconnects includes a controlled collapse chip connection (C4) bond.

In an embodiment, the contact elements of the plurality of storage elements are arranged in one of a series or a parallel electrical connection.

In an embodiment, the plurality of interconnected energy storage elements include a plurality of solid-state batteries or solid-state supercaps.

In an embodiment, the plurality of energy storage elements are stacked vertically in a Z-plane.

In an embodiment, the plurality of energy storage elements are stacked in one of an X-Y plane or an X-Z plane.

In one embodiment, an integrated circuit carrier package includes a silicon carrier. A smart chip is electrically connected to the silicon carrier. An I/O device is electrically connected to the silicon carrier. A plurality of aligned and bonded energy storage elements includes at least one pass-through isolated connection to the smart chip and the I/O device, and the contact elements arranged on each of the storage elements comprising an anode, a cathode, and an isolated common pad. A multi-signal electrical flexible cable is arranged to connect the silicon carrier and the respective anode and cathode of each the plurality of energy storage elements. The plurality of energy storage elements is arranged in a stack in which the isolated common pad is connected to the multi-signal electrical flexible cable and shorted to one of the anode or the cathode by bonded conductive interconnects.

In an embodiment, the connections of conductive interconnects of the energy storage elements to the electrical flexible are selectively configurable to the electrical flexible to vary a current or voltage.

In one embodiment, a method of multichip assembly, includes aligning and bonding a plurality of first conductive interconnects to at least a first integrated circuit chip and a second integrated circuit chip. A plurality of energy storage elements are arranged in a stack. A plurality of second conductive interconnects are aligned and bonded to the plurality of energy storage elements and to at least one of the first integrated circuit chip and the second integrated circuit chip. The plurality of energy storage elements include an anode, a cathode, and an isolated common pad; and the isolated common pad is electrically connected by shorting one of the anode or the cathode with the isolated common pad.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

Figure 1:
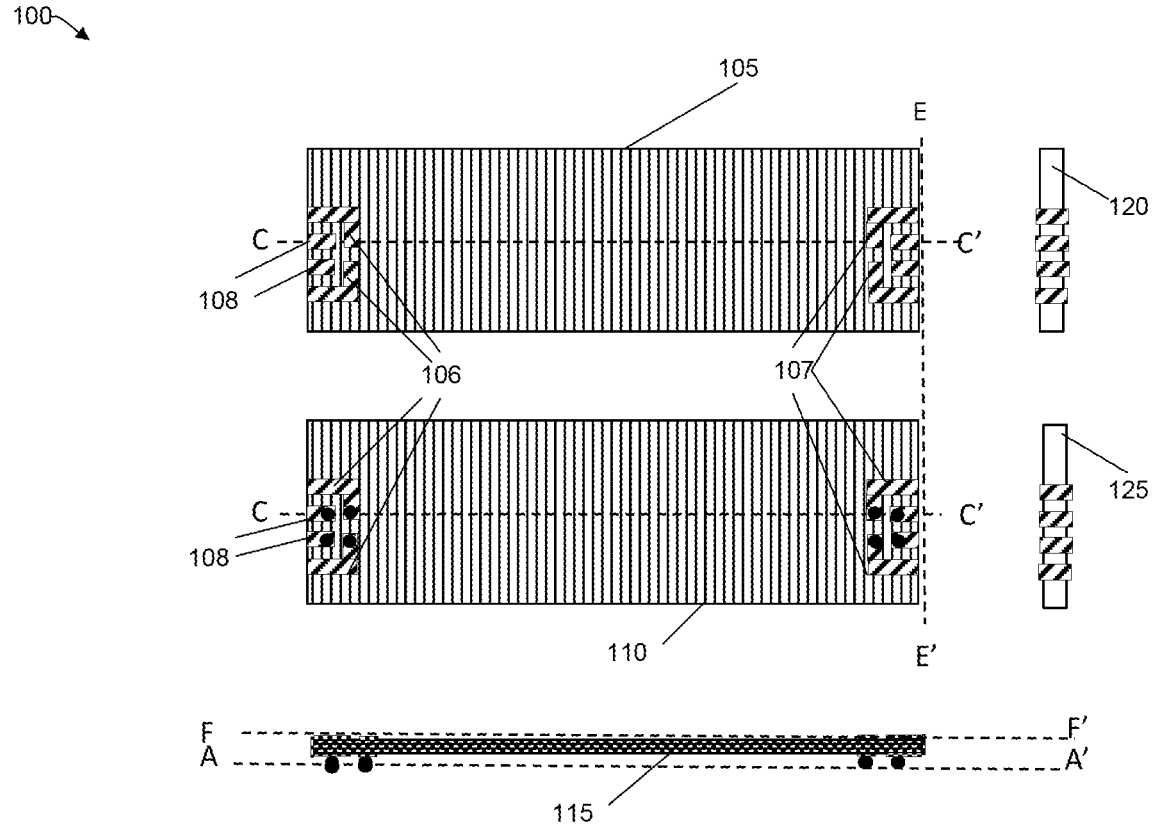
FIG. 1 is an illustration of an energy storage device, consistent with an illustrative embodiment.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, the present disclosure relates to a scalable, solid-state battery and/or a supercapacitor (a.k.a "ultra capacitor" or "supercap"). Solid-state batteries, for example, are constructed of solid electrodes and a solid electrolyte, in place of liquid or gel electrolytes found in wet-cell batteries. Supercaps are high-capacity capacitors that utilize double-layer capacitance and electrochemical pseudo-capacitance instead of a dielectric. Supercaps can store more energy than electrolytic capacitors, and can be charged and deliver charge faster than batteries, and may have more charge and discharge cycles than rechargeable batteries.

A "smart chip," as discussed herein, refers to a very small device that has at least a microprocessor, state machine, or other logic circuitry, and resources for data processing. For example, a smart chip may be embedded in the layers of a smart card such as a credit card, and can be configured for authentication, data processing, data storage and communication, just to name a few possible operations. Smart ships may be hermetically sealed and can be arranged in a package such as an integrated circuit carrier package that includes optical I/O, and/or RIF I/O. Such integrated circuit carriers are often untethered from a power source, and may include energy harvesting utilizing, (for example, via photovoltaics, kinetic energy, or RF energy from the environment via an antenna) to operate. In addition, solid-state batteries or supercaps may be used to provide charge storage for a lasting source of power, and may be stackable to provide various voltages or currents for the integrated circuit package as desired. It should be understood through the disclosure that the illustration and reference to smart chips, LED, and optical and RF I/O are provided for illustrative purposes and do not limit the appended claims to the illustrations described herein.

The use of the isolated common pad facilitates customizable battery stacking arrangements in various planes (Z plane, a 180 degree rotation in the X-Y plane, or a 180 degree rotation in the Y-Z plane, as needed. In addition, it is to be understood that the present disclosure is not limited to C4 bonding, and for example, chip-thru-vias may be used. By stacking the batteries in various arrangements and in series or parallel connections, a desired at least one voltage or current for the integrated circuit package can be provided without requiring specialized batteries. Through the use of solid-state batteries and/or supercaps, the integrated circuit carrier package can be untethered from a power source and provide a relatively long life without periodic serviceability that would be performed for conventional rechargeable batteries.

Example Constructions

FIG. 1 illustrates a construction of an energy storage device 100 consistent with an illustrative embodiment. An energy storage element 105 is shown in a top view through view line F-F', bottom view 110 through view line A-A', cross-sectional view 115 through view line C-C', and sides 120 and 125 through view line E-E'. The energy storage element 105 includes, for example, contact elements arranged thereon including an anode 106, a cathode 107, and an isolated common pad 108. The energy storage element 105 may be a solid state battery or a supercap. In this illustrative embodiment, the anode 106, cathode 107 are pads are arranged with the isolated common pad 108 along a perimeter of the energy storage element 105 to facilitate mechanical stacking. The black dots on the anode pad 106, cathode 107 and isolated common pad 108 represent, for example, controlled collapse chip connection (C4) bonds, as the contact elements maybe respectively aligned and bonded by type.

The energy storage elements 105 may be stacked, for example, from top to bottom in a Z-plane via C4 bonding, by 180 degree rotation in an X-Y plane, and/or by 180 degree rotation in the Y-Z plane. The isolated common pad 108 may be shorted to one of the anode or the cathode by bonded conductive interconnects. Thus, the battery is a three terminal energy storage device in which one of the terminals is isolated from the anode and the cathode.

Figure 2:
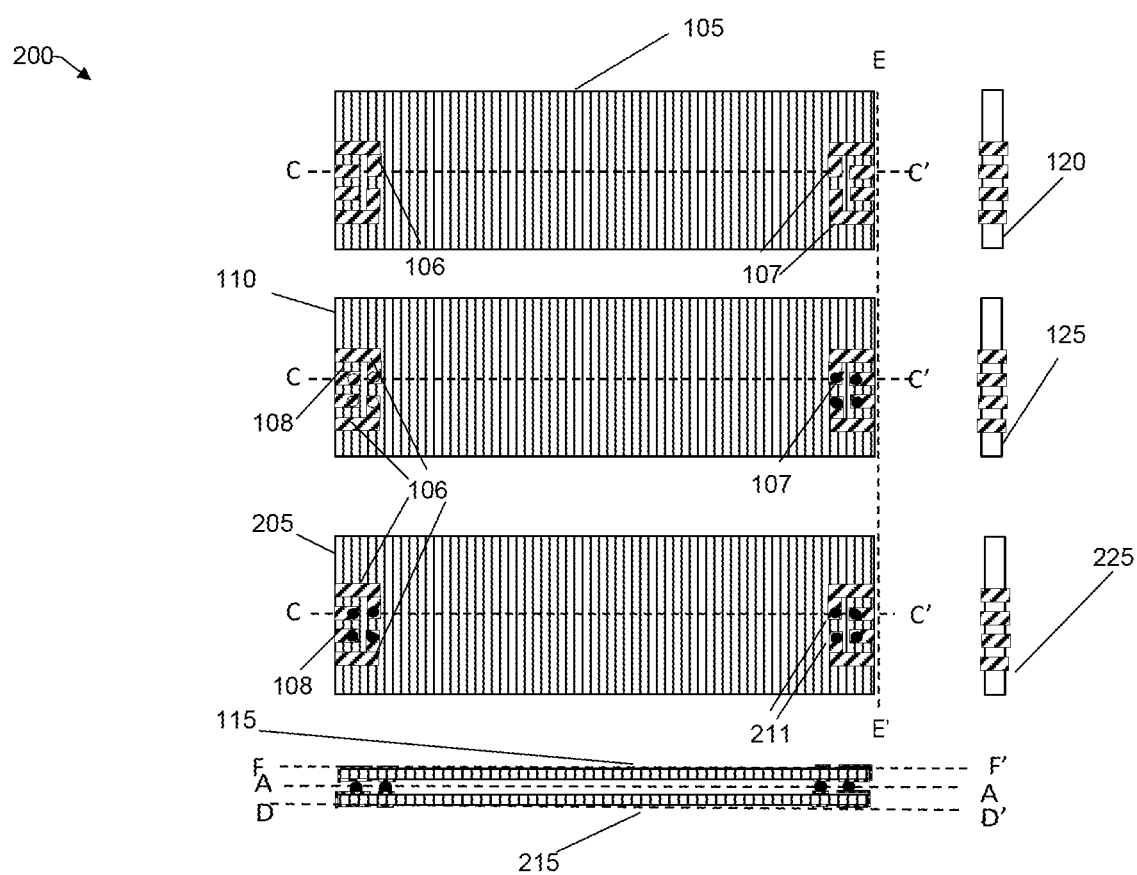
FIG. 2 is an illustration of an energy storage device having stackable energy storage elements, consistent with an illustrative embodiment.

FIG. 2 shows an energy storage device 200 having stacked batteries 115, 215. The battery 215 is shown in a bottom view 205 through view line D-D' and side view 225 through view line E-E', along with anode pads 106, cathode pads 107, and isolated common pads 108. The batteries 105, 205 can be modularly stacked, as various integrated circuit packages have different energy requirements, and the modular stacking facilitates construction of the various integrated circuit packages. In FIG. 2, the energy storage elements are electrically connected in parallel. The batteries 115, 215 may be solid state, primary or secondary, which are connected in parallel by stacking, the anode and cathode pads of 215, to the anode and cathode pads, respectively of 115 using relatively low temperature C4 bonding in a package. There can be a redundancy pad pattern of anode pads 106, cathode pads 107 and isolated common pads. The redundancy pattern is optional, and both increased current flow is provided with parallel pads lowering resistance and increased reliability is provided with redundancy. In addition, sometime C4 bonding could be defective, thus, the redundant bonding increases the manufacturing yield versus non-redundant bonding.

Figure 3:
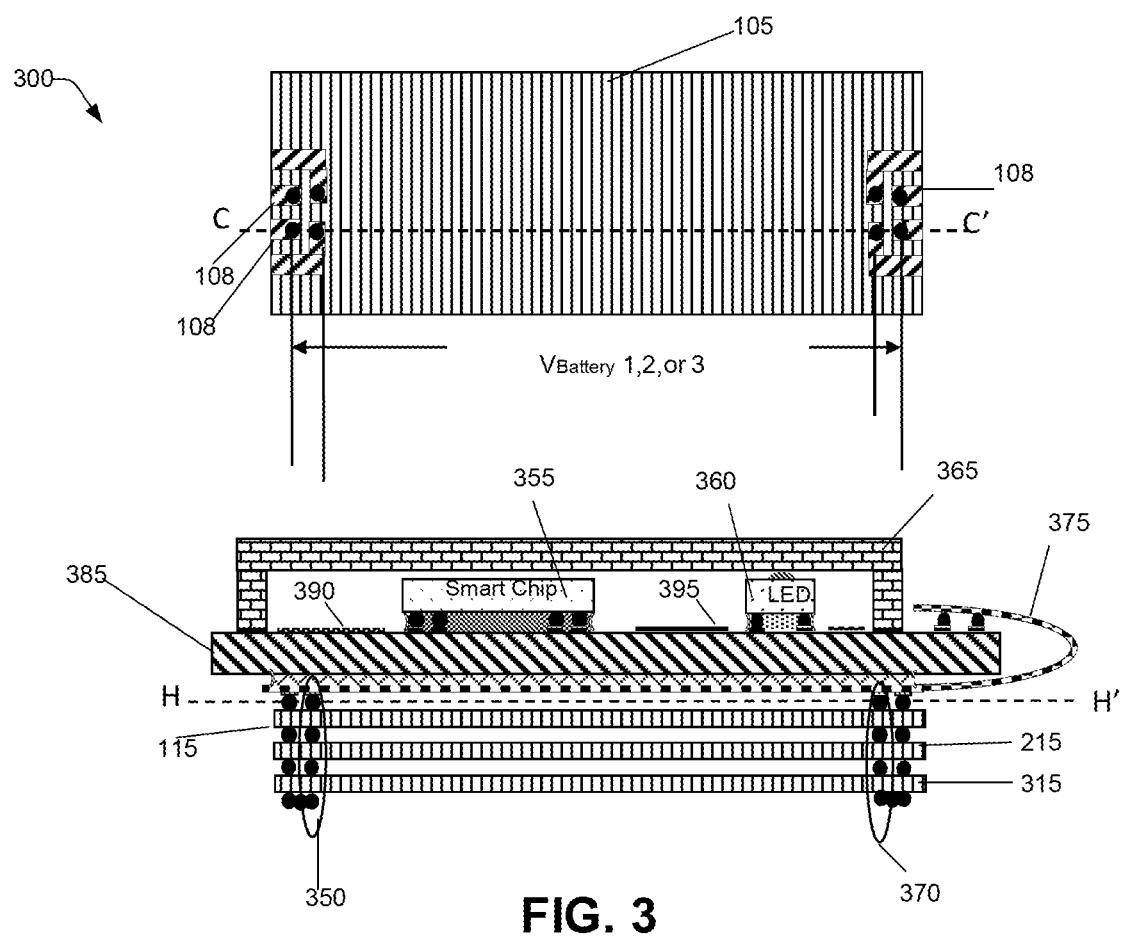
FIG. 3 is an illustration of an integrated circuit carrier package including optical I/O and having stackable energy storage elements arranged in parallel, consistent with an illustrative embodiment.

FIG. 3 is an illustration of an integrated circuit carrier package 300 including optical I/O and having stackable energy storage elements arranged in parallel, consistent with an illustrative embodiment. The integrated circuit carrier package 300 includes three stackable batteries 115, 215, 315 electrically connected by an electrical flexible cable 375 of view line C-C'. The electrical flexible cable 375 is a multi-signal cable that is also electrically connected to a silicon carrier 385 via pads using conductive bonding. For example, in this illustrative embodiment, C4 bonding is used. However, it is to be understood by a person of ordinary skill in the art that the disclosure is not limited to C4 bonding. The integrated carrier includes a package lid 365 that at least partially protects some of the electronic components arranged on the silicon carrier 385. For example, a smart chip 355 and an LED 360 are shown. The smart chip 355 can be hermetically sealed. In addition, the anode pads 106 and the cathode pads 107 are respectively connected in parallel by C4 bonding 350 and 370, respectively. By stacking the batteries 115, 215, 315 in parallel, the same voltage with three times more current or power density is provided. Battery 105 is top view of view line H-H'

The LED 360 can be tailored to a photodetector reader, configurable for focusing, defocusing. The LED 360 may have a separate lens, or can be self-aligned, for example, by solder melt lateral wetting forces to the LED or a dielectric layer fabricated onto a GaN LED substrate, and anisotropically etched to the lens. It is obvious to anyone skilled in the art that the package lid 365 can be of material transparent to the wavelengths of LED or photodetector, which can include, but not limited to, glass or quartz. Other components, such as photodetector 390 or photovoltaics 395 for energy harvesting that my recharge batteries 115, 215, 315, may be fabricated in or on the silicon carrier 385.

Figure 4:
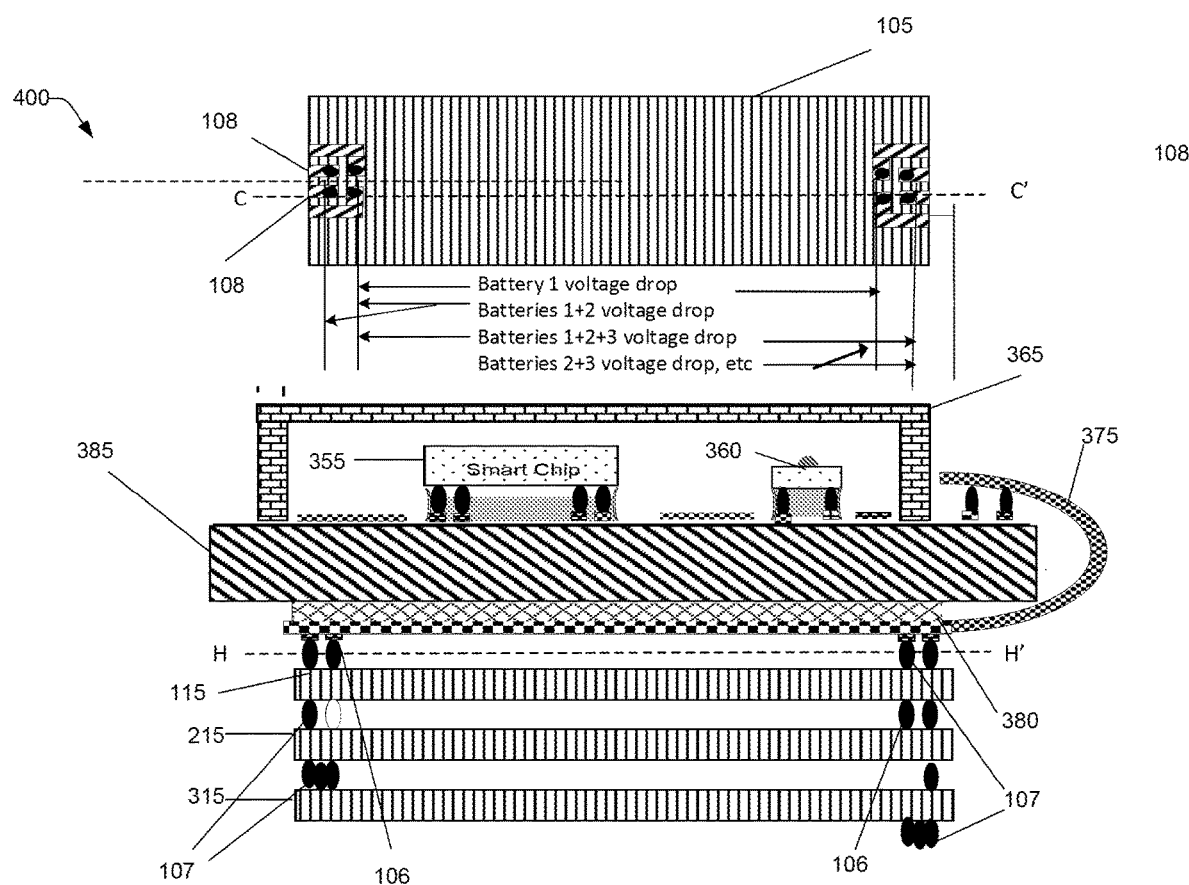
FIG. 4 is an illustration of an integrated circuit carrier package including optical I/O having stackable energy storage elements arranged in series, consistent with an illustrative embodiment.

FIG. 4 is an illustration of an integrated circuit carrier package 400 including optical I/O having stackable energy storage elements arranged in series, consistent with an illustrative embodiment. The integrated package 400 shown in FIG. 4 is similar to the illustration in FIG. 3 but has a different layout of anode and cathode pads for the stacked batteries to facilitate a series connection. For example, it can be seen, by cross section through view line C-C', that the connection to the anode pads 106 and cathode pads 107 are arranged to alternate on the ends of the stack of batteries 115, 215, 315. By attaching the batteries 115, 215, 315 in series, in the case of a stack of three batteries, the voltage provided to the carrier package can be tripled if the three individual batteries are of the same voltage. Moreover, the three individual batteries can have different voltages but have similar dimensions and pad locations, where the sum of the three individual battery voltages would add for the total voltage. In addition, the individual battery voltage of 115, 215, 315, or any combination of two battery voltages, 115+215, 115+315, or 215+315, or the sum of all battery voltages, 115+215+315 are all made available to the electrical flexible cable 375 at view line H-H' by various combinations of two pads as shown on battery top side 105. Further, to obtain all combinations of battery voltages for four or more different voltage batteries connected in series can be accomplished with additional isolated common pads.

Figure 5:
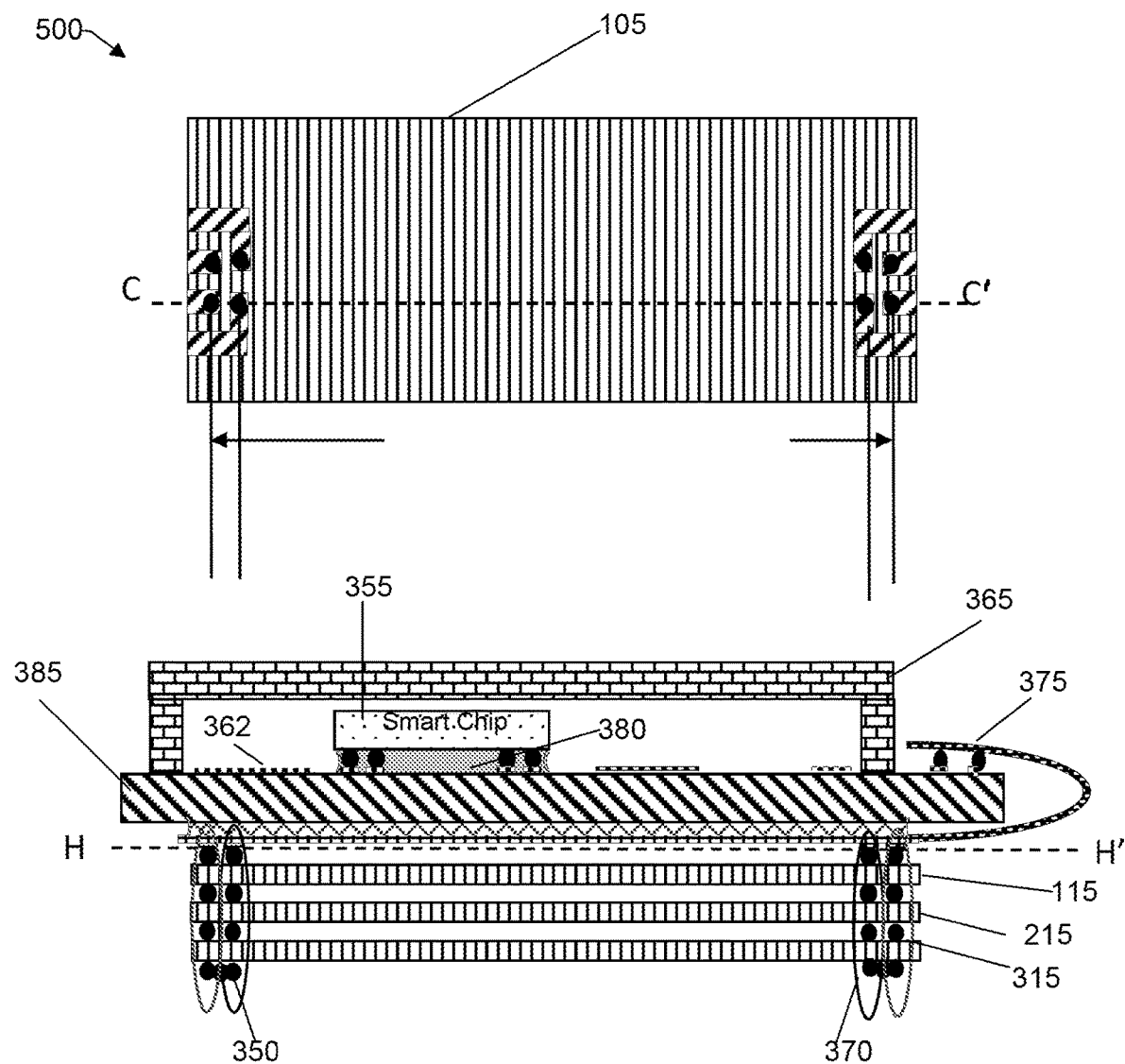
FIG. 5 is an illustration of an integrated circuit carrier package including RF I/O and having stackable energy storage elements arranged in parallel, consistent with an illustrative embodiment.

FIG. 5 is an illustration of an integrated circuit carrier package 500 including RF I/O and having stackable energy storage elements arranged in parallel, consistent with an illustrative embodiment. The integrated circuit package shown in FIG. 5 includes, for example, through view line C-C', a smart chip 355 arranged on a silicon carrier 385, a protective lid 365, and a multi-signal electrically flexible cable 375 arranged via an adhesive 380 to electrode pads on the silicon carrier 385 and to anodes and cathodes of the stacked batteries 115, 215, 315 in a parallel connection. Compared with FIG. 3 which have components representative for optical communication, for example, an LED 360, the integrated carrier package 500 may have components representative for RF communication, for example, an antenna 362 (e.g., a loop, dipole, etc.) arranged on a circuit side of the silicon carrier, or even on the package lid 365. In this illustrative embodiment, there are three stacked batteries connected in parallel on the underside of the silicon carrier 385, and a protective lid 365.

Figure 6:
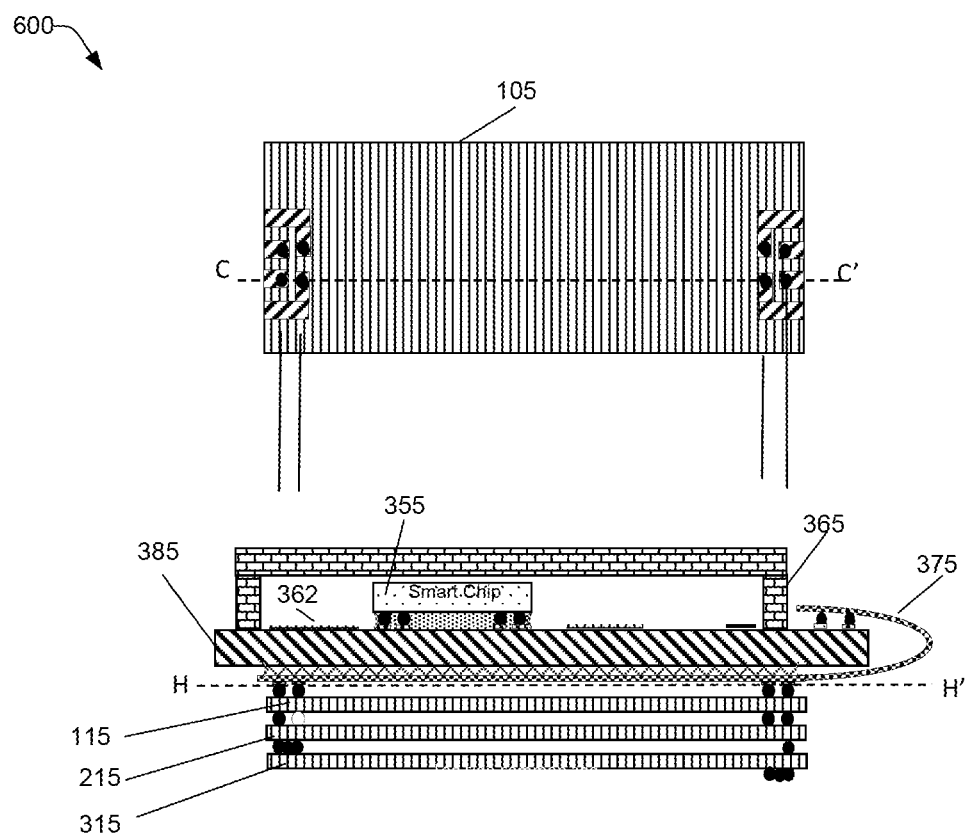
FIG. 6 is an illustration of an integrated circuit carrier package including RF I/O and having stackable energy storage elements arranged in series, consistent with an illustrative embodiment.

FIG. 6 is an illustration of an integrated circuit carrier package 600 including RF I/O and having stackable energy storage elements arranged in series, consistent with an illustrative embodiment. The integrated circuit package 600 shown in FIG. 6 is similar to the integrated circuit package 400 shown in FIG. 4, except that there can be an RF I/O in place of the LED 360, such as a circuit antenna 362. The batteries 115, 215, 315 are connected in series and thus the anode pads and cathode pads will alternate on different ends of each successively stacked battery to facilitate the series connection via the multi-signal electrical flexible cable 375.

Figure 7:
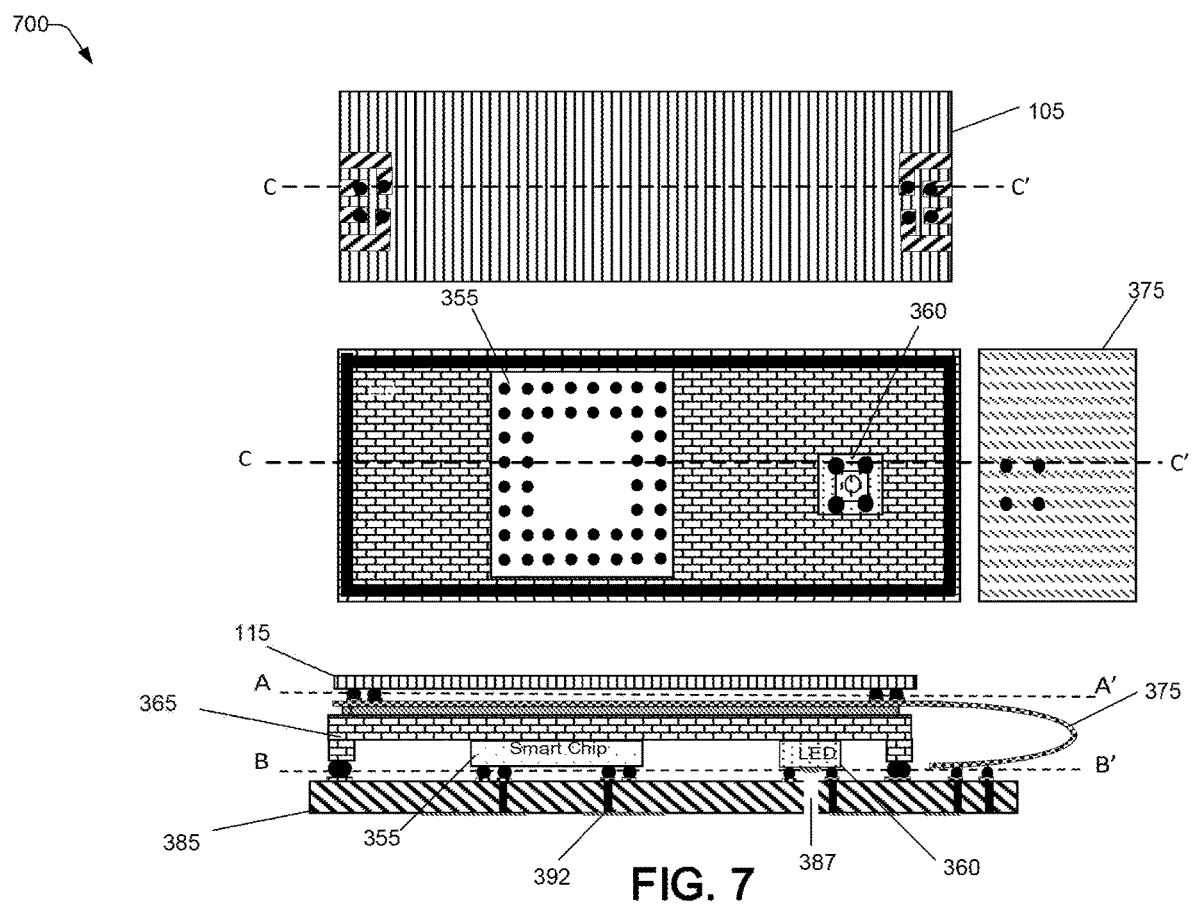
FIG. 7 is an illustration of an integrated circuit carrier package having a smart chip, Optical I/O, and a battery, consistent with an illustrative embodiment.

FIG. 7 is an illustration of an integrated circuit carrier package 700, having a smart chip, Optical I/O and a battery, consistent with an illustrative embodiment. In this illustrative embodiment of cross sectional view line C-C', the battery 115 is arranged above the protective lid 365. The multi-signal electrical flexible cable 375 connects the anodes and cathodes of the battery 115 to the silicon carrier 385. The circuit side of the silicon carrier 385 through view line B-B' shown in FIG. 7 is on the lower surface and is configured for photovoltaic (PV) and photodiode (PD) regulation. The silicon carrier 385 may have conductive electrical thru-vias 392 and optically transparent thru-vias 387.

Figure 8:
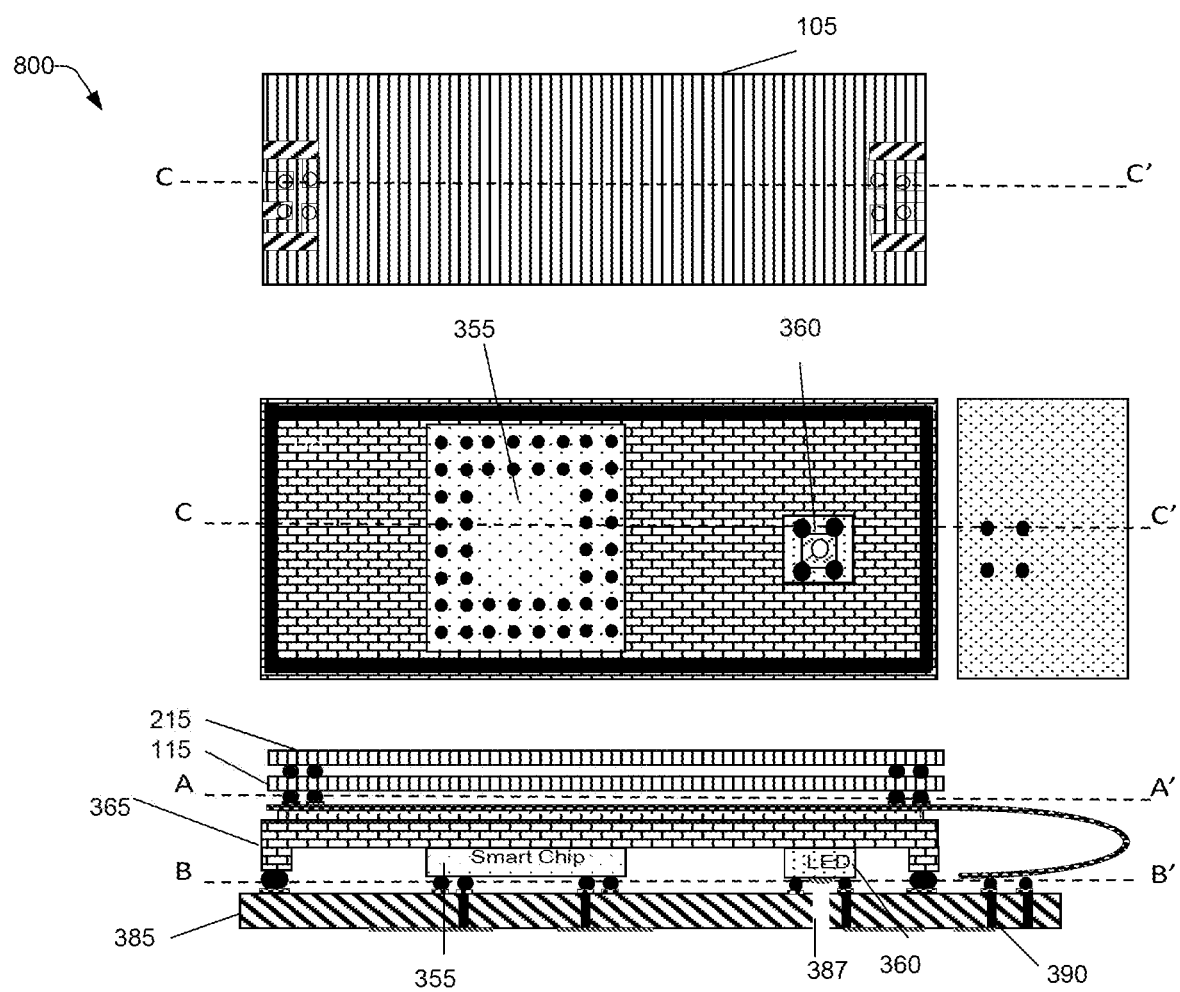
FIG. 8 is an illustration of an integrated circuit carrier package having a smart chip and Optical I/O with two stackable batteries or supercaps, consistent with an illustrative embodiment.

FIG. 8 is an illustration of an integrated circuit carrier package 800 having a smart chip and Optical I/O with two stackable batteries or supercaps, consistent with an illustrative embodiment. FIG. 8 shows multi-stacker batteries 115, 215 arranged on top of the protective lid 365. The silicon carrier 385 may be an active carrier, containing an energy harvesting (photovoltaic/RF), communication (photo-diode), energy (battery regulation and monitoring) and other circuits. There can be a hermetical metal seal, for example, a solder seal between a Cu lid and a Cu surface trace. As shown in FIG. 8, there is an transparent optical through via 387 in the silicon carrier 385 to permit a light path from the LED to the exterior of the integrated circuit package.

Figure 9:
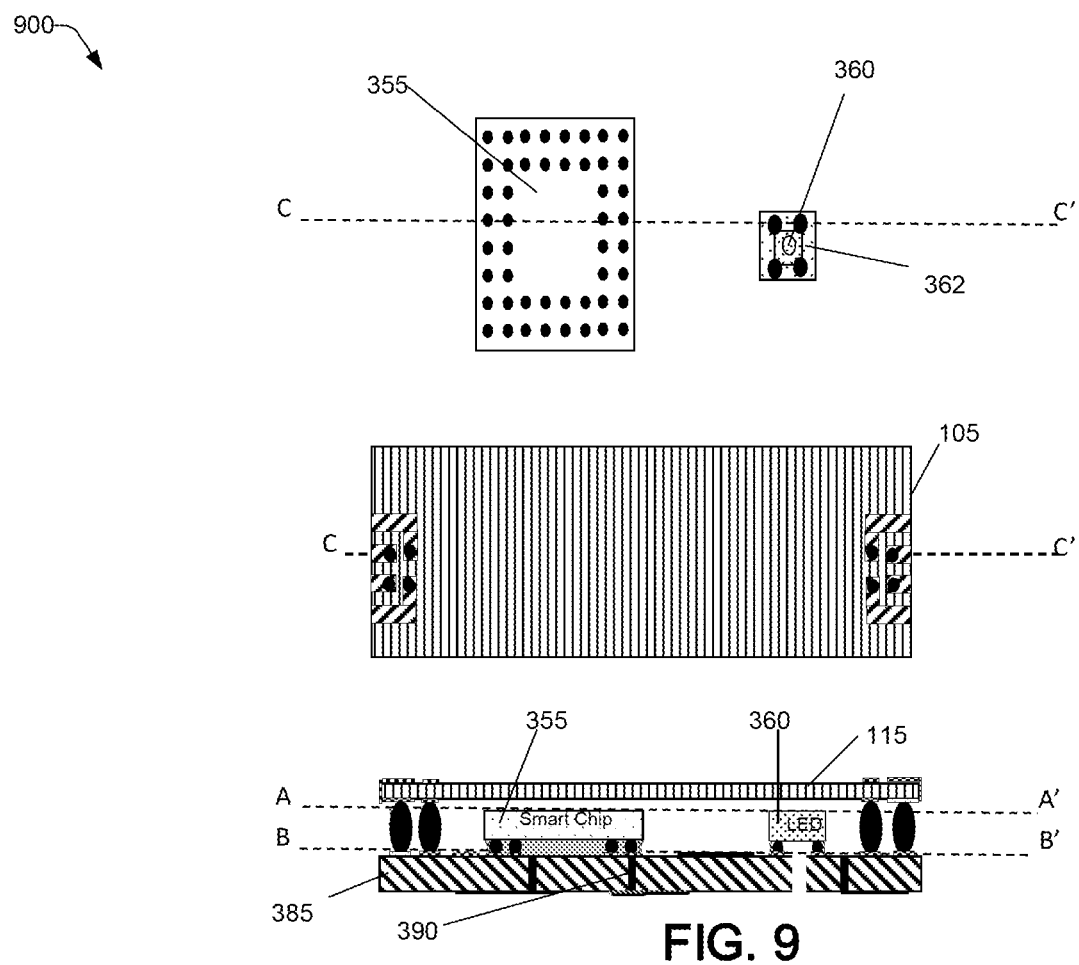
FIG. 9 is an illustration of an integrated circuit carrier package having a smart chip with an Optical I/O and a battery or supercap, consistent with an illustrative embodiment.

FIG. 9 is an illustration of an integrated circuit carrier package 900 having a smart chip with an Optical I/O and a battery or supercap, consistent with an illustrative embodiment. FIG. 9 shows a bottom view looking up through the cross-section B-B' and cross-section A-A'. The LED 360 is backside transmitting through a transparent substrate, for example, such as sapphire. 362. Alternatively, a reflective front-side mirror can be used to perform the backside transmitting.

Figure 10:
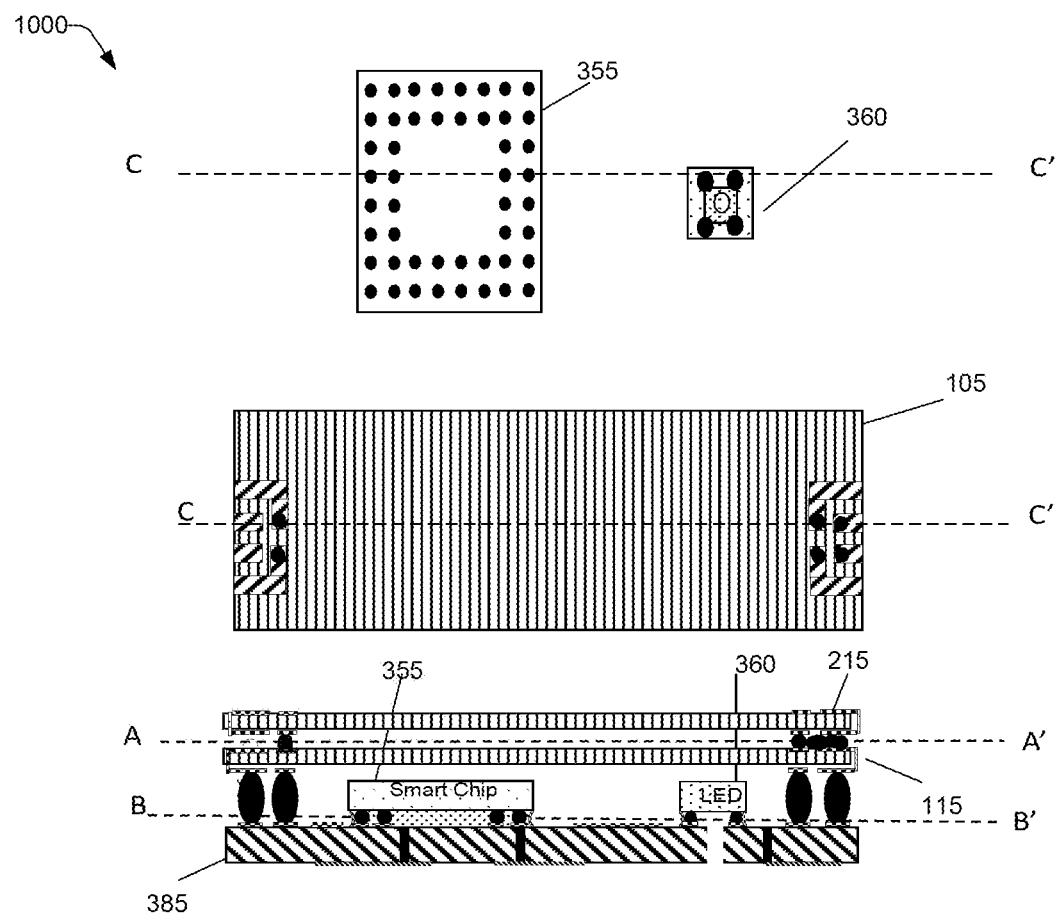
FIG. 10 is an illustration of an integrated circuit carrier package having a smart chip with an Optical I/O and two stackable batteries, consistent with an illustrative embodiment.

FIG. 10 is an illustration of an integrated circuit carrier package 1000 having a smart chip with Optical I/O and two stackable batteries in series, consistent with an illustrative embodiment. FIG. 10 shows two stackable batteries 115, 215 arranged above the silicon carrier 385. A smart chip 355 and an LED 360 are arranged on the silicon carrier 385.

Figure 11:
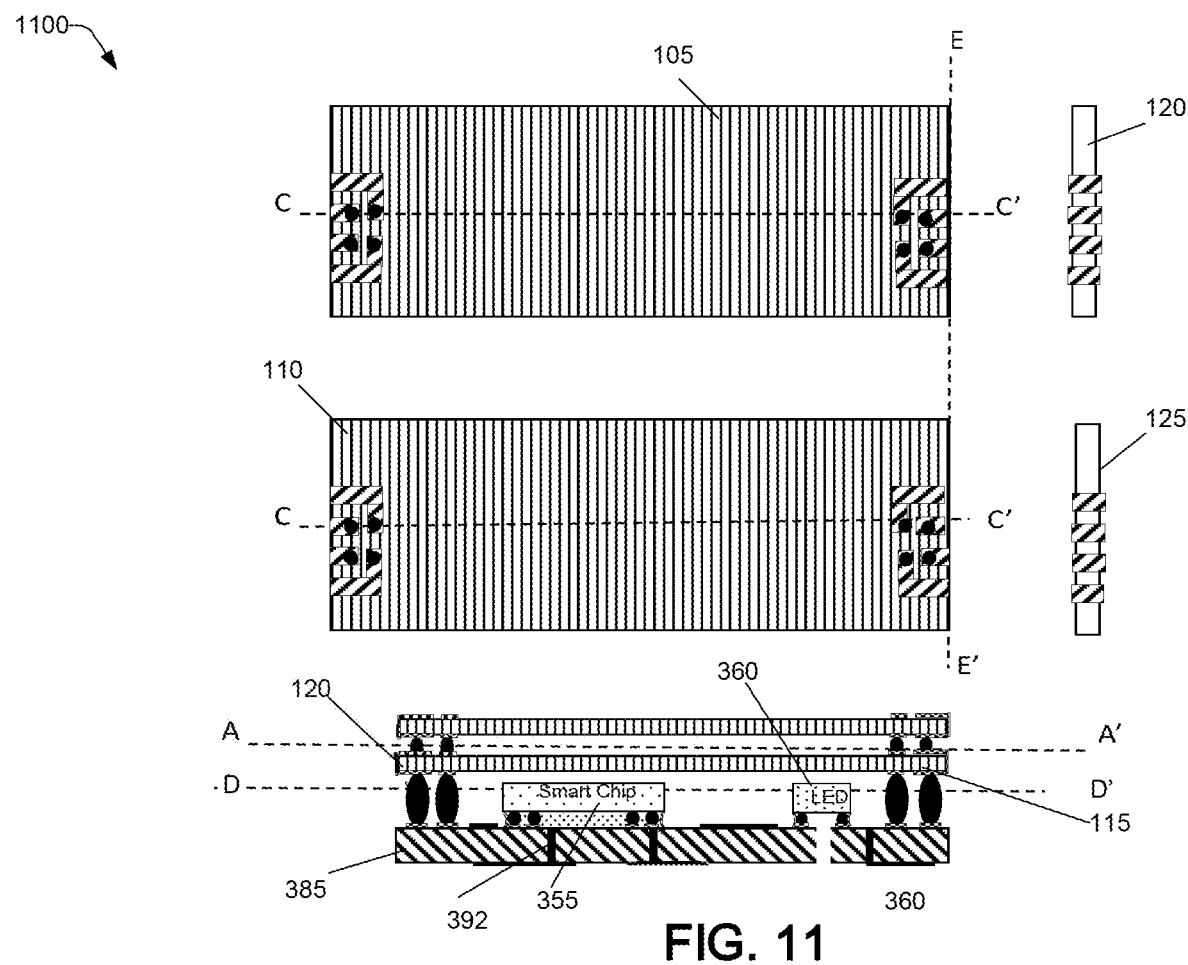
FIG. 11 is an illustration of a circuit carrier package including a Smart Chip with Optical I/O and two stackable batteries in parallel, consistent with an illustrative embodiment.

FIG. 11 is an illustration of a circuit carrier package 1100 including line view C-C' showing a Smart Chip with Optical I/O and two stackable batteries in parallel, consistent with an illustrative embodiment. The anodes and cathodes pad are aligned at opposite ends of the batteries 115, 215 (i.e. batteries are of the same orientation and only displaced in the vertical direction) along with the battery-isolated common pads as shown with line view A-A' and D-D', respectively. The batteries 115, 215 can be connected in series or parallel by masking/unmasking the battery contacts.

Figure 12:
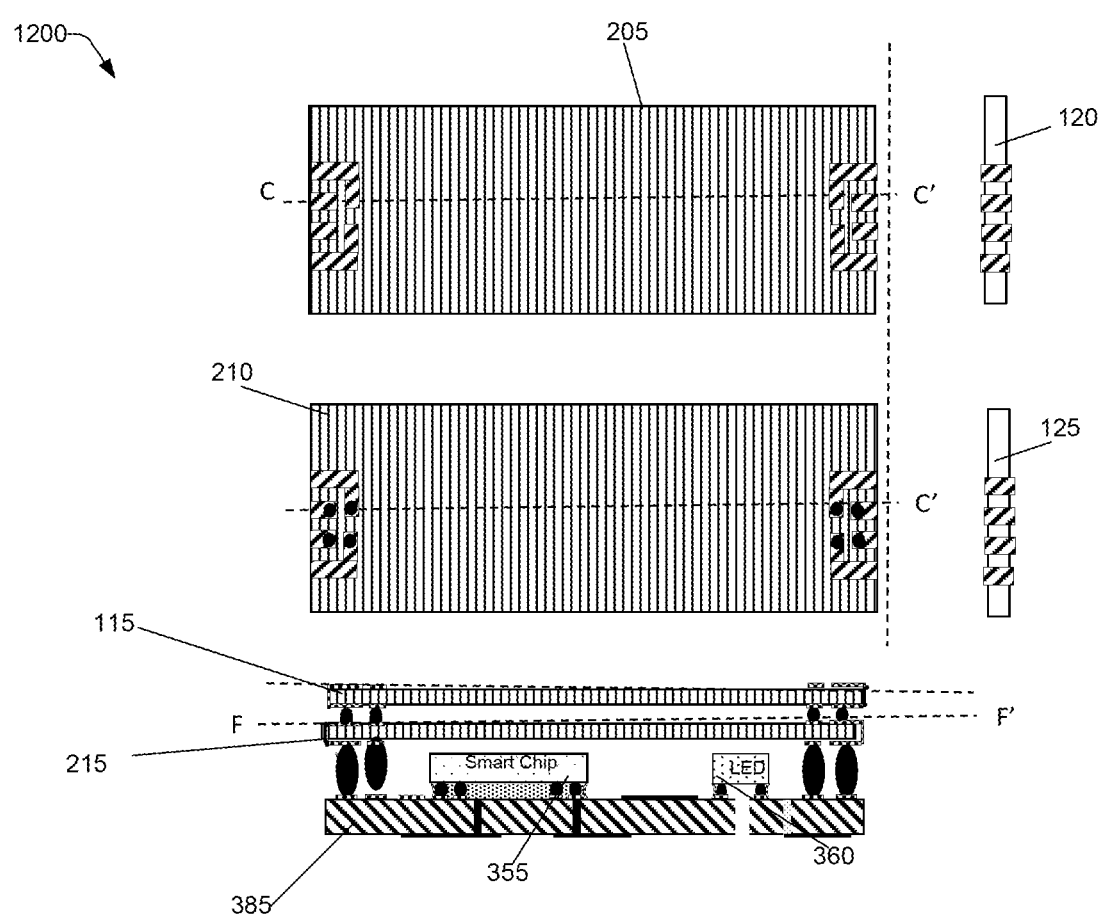
FIG. 12 is another illustration of a circuit carrier package including a Smart Chip with Optical I/O and two stackable batteries in parallel, consistent with an illustrative embodiment.

FIG. 12 is another illustration of a circuit carrier package 1200 including a Smart Chip with Optical I/O and two stackable batteries in parallel, consistent with an illustrative embodiment. In this illustrative embodiment, the top side 205 of battery 215 is unbonded (no C4s) because the bottom side 210 provides bonded contacts to the second battery 215.

Figure 13:
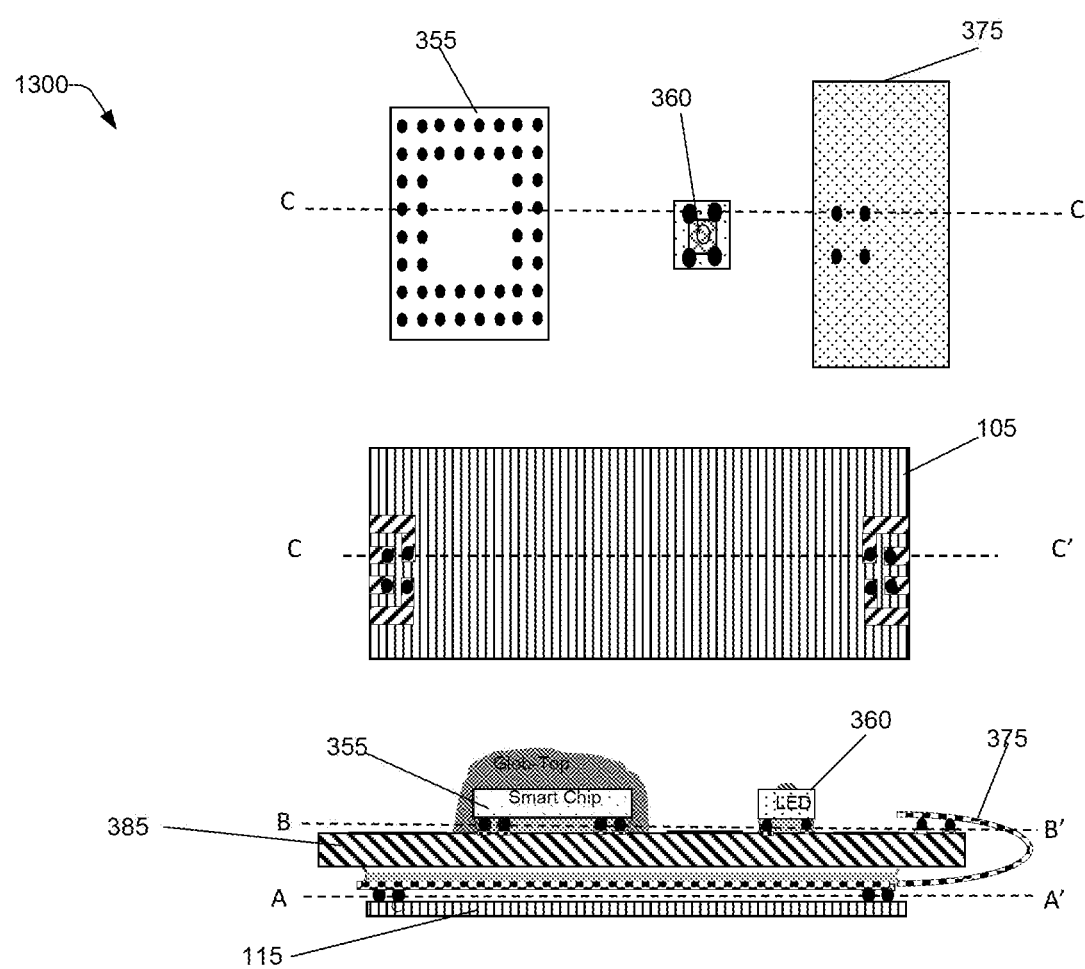
FIG. 13 is an illustration of a circuit carrier package including a smart chip, an optical I/O, and a battery, consistent with an illustrative embodiment.

FIG. 13 is an illustration of a circuit carrier package 1300 including a smart chip, an optical I/O and a battery, consistent with an illustrative embodiment. As shown in FIG. 13, a glob-top encapsulation of the smart chip 355 is shown to protect the chip from environmental and shock hazards. The glob-top can be used instead of the protective lid shown in some of the previous illustrative embodiments.

Figure 14:
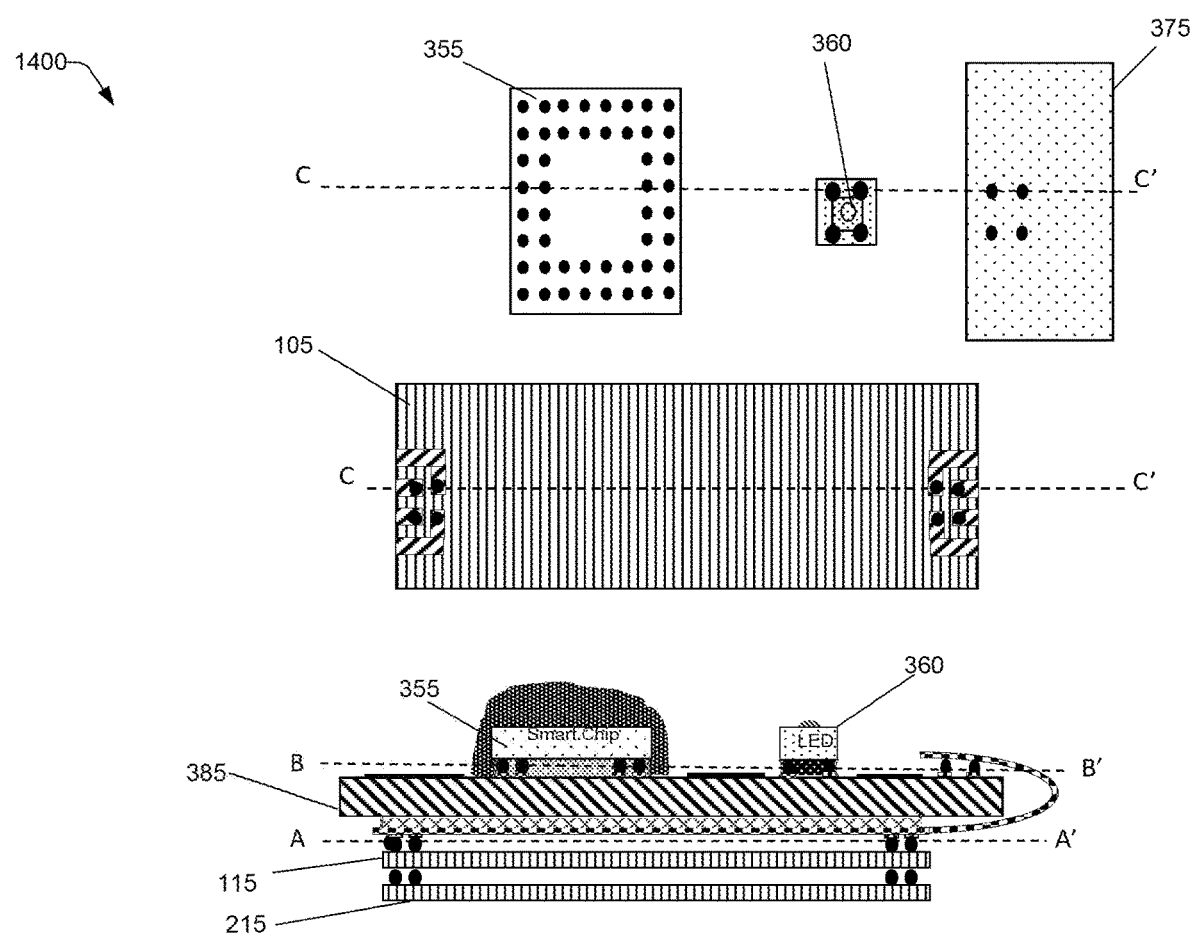
FIG. 14 is an illustration of a circuit carrier package including a smart chip, optical I/O, and two stackable batteries, consistent with an illustrative embodiment.

FIG. 14 is an illustration of a circuit carrier package 1400 including a smart chip, optical I/O and two stackable batteries, consistent with an illustrative embodiment. The configuration of FIG. 14 is similar to the configuration of FIG. 13, except that there are stackable batteries 115, 215. The LED 360 can be a backside transmitting through a transparent substrate, or by front-side mirror reflection. The smart chip 355 and the LED 360 are arranged on the circuit side of the silicon carrier 385, which also contains photovoltaic and/or photodiode devices and regulation circuitry.

Figure 15:
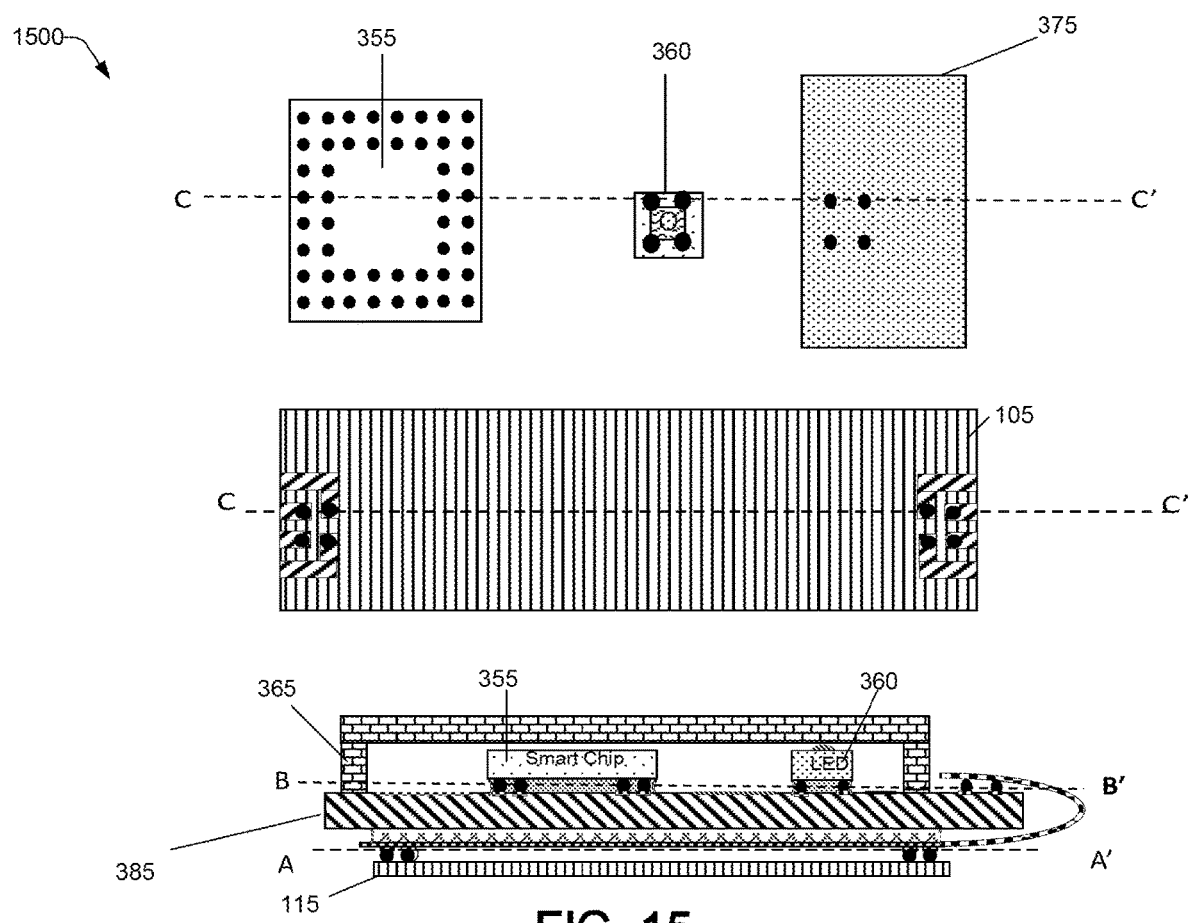
FIG. 15 is an illustration of a circuit carrier package including a smart chip, optical I/O, and a stackable modular battery, consistent with an illustrative embodiment.

FIG. 15 is an illustration of a circuit carrier package 1500 including a smart chip, optical I/O and a stackable modular battery, consistent with an illustrative embodiment. In this illustrative embodiment, the smart chip 355 and the LED are arranged on the silicon carrier 385, along with circuitry for at least one of photovoltaic (PV) and/or photodiode (PD) device and circuit regulation. Energy harvesting can be performed by a photovoltaic or RF arrangement. The PV arrangement would include cells that generate a voltage with exposure to light. An RF arrangement for energy harvesting can utilize an antenna to harvest RF waves on the bottom side or topside of the package lid 365. In the communication case of a PD arrangement (incoming optical signal receiver), the LED would be utilized for outgoing optical signal transmitter. The package lid 365 can be made of a transparent material (e.g., glass, quartz, etc.) to the wavelengths used in optical communication. The package lid 365 is used to at least partially cover the silicon carrier and components such as the smart chip 355 and LED 360. In addition to, or in lieu of the package lid 365, a glob-top epoxy can be used to hermetically seal and protect the smart chip 355 from environmental conditions such as moisture, dirt, temperature variations, and physical stress.

Figure 16:
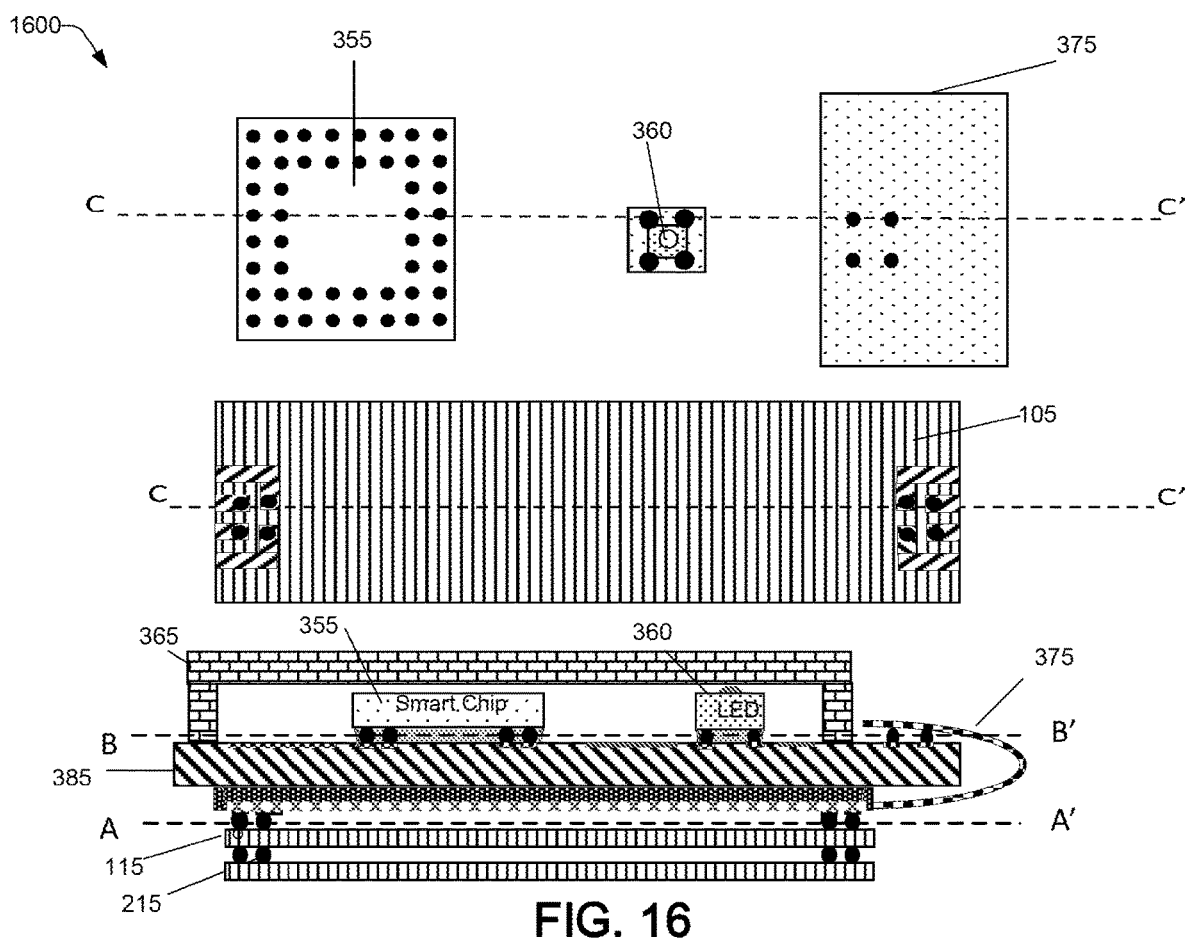
FIG. 16 is an illustration of a circuit carrier package including a smart chip, optical I/O, and a stackable modular battery consistent with an illustrative embodiment.

FIG. 16 is an illustration of a circuit carrier package 1600 including a smart chip, optical I/O and a stackable modular battery consistent with an illustrative embodiment. In this illustrative embodiment, there are batteries 115, 215 stacked below the silicon carrier 385. The anode and cathode pads are connected in parallel utilizing, for example, C4 bonding on a multi-signal electrical flexible cable 375 that connects the batteries to contacts such as pads on the silicon carrier 385. The flex cable may be supported by an adhesive along the silicon carrier. An underfill material can be arranged in an area above the battery 115 and below a lower side of the silicon carrier 385.

Figure 17:
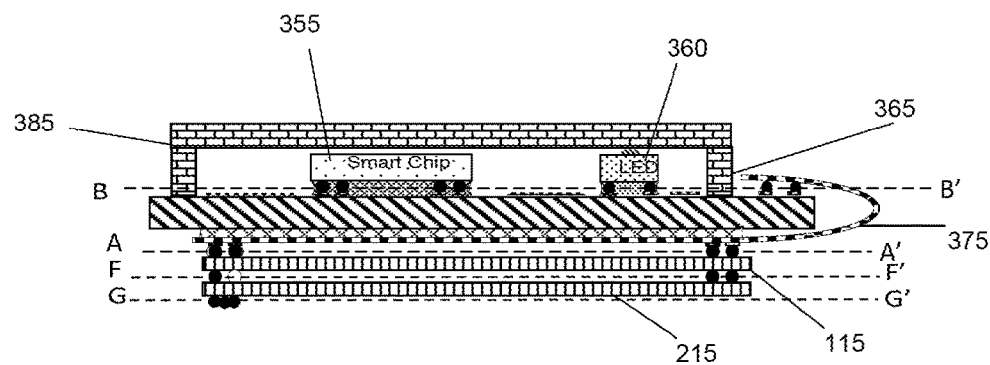
FIG. 17 is an illustration of a circuit carrier package including a smart chip, optical I/O, and two stackable batteries in series, consistent with an illustrative embodiment.

FIG. 17 is an illustration of a circuit carrier package including a smart chip, optical I/O, and two stackable batteries 215, 215 in series, consistent with an illustrative embodiment. In this illustrative embodiment, the anodes and cathodes of the batteries are arranged to facilitate a series connection to a multi-signal flexible cable 375 that is also connected to contact pads on the silicon carrier 385. The batteries are stacked vertically in a Z-plane, with a 180 degree rotation in an X-Y plane or a 180 degree rotation in an X-Z plane.

Figure 18:
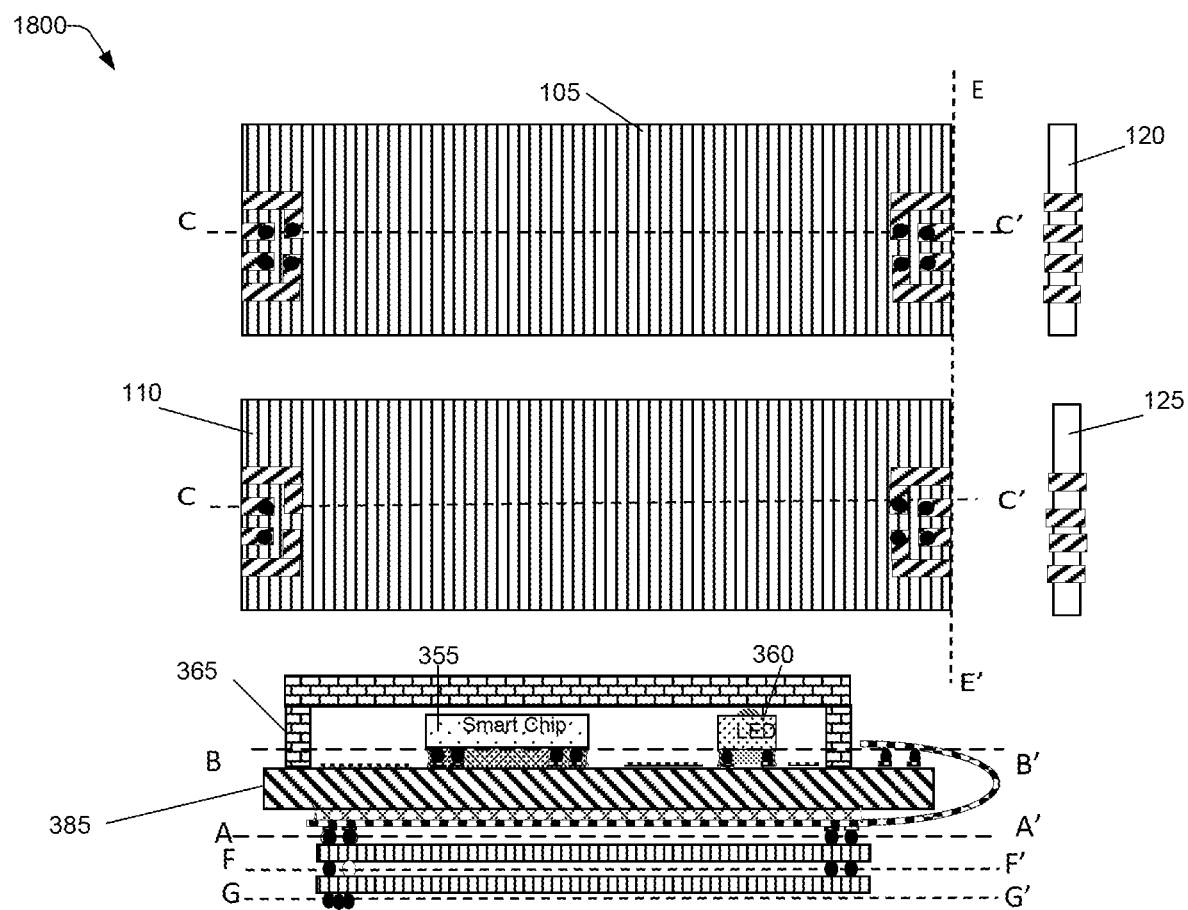
FIG. 18 is an illustration of a circuit carrier package including a smart chip, optical I/O. and a stackable modular battery in series, consistent with an illustrative embodiment.

FIG. 18 is an illustration of a circuit carrier package including a smart chip, optical I/O. and two stackable modular battery in series, consistent with an illustrative embodiment. The batteries include an isolated pad in addition to the anode pad(s) and the cathode pad(s). In this illustrative embodiment, a top side 105 of the battery 115, view line A-A', the common pad, anode pad, cathode pad and common pad, from left to right, respectively, of view line C-C', is C4 bonded, but the bottom side 110 of the battery 115, view line D-D', the common pad, the cathode pad and the common pad, from left to right, respectively, of view line C-C', is C4 bonded, but the anode pad is unbonded. The stacked batteries left most isolated common pads are shorted via C4s to the second battery 215 after a 180 degree rotation in the X-Y plane. In the aforementioned construction, the flexible cable routes (1) ground via anode pad of battery 115, (2) the voltage across the first battery via the voltage difference between anode pad and cathode pad of battery 115, (3) the voltage across the second battery via the voltage difference between anode pad and cathode pad of battery 215, and (4) the voltage across both batteries 115 and 215 via the voltage difference between anode pad of battery 115 and the left-most common pad (which is shorted to the cathode pad of battery 215). Note that when the second battery 215 is rotated 180 degrees in the X-Y plane, its anode pad is C4 connected (shorted) to the cathode pad of battery 115.

Figure 19:
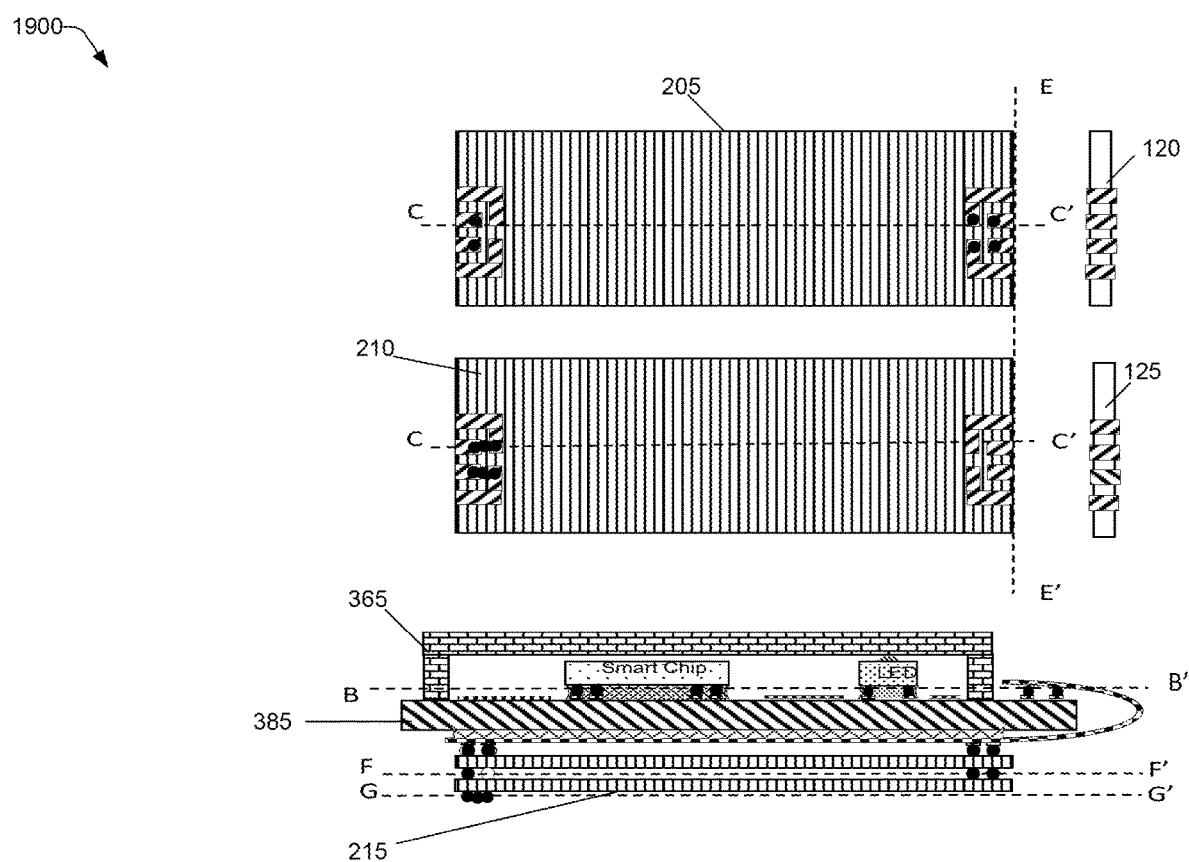
FIG. 19 is an illustration of a circuit carrier package including a smart chip, optical I/O and stackable modular battery in series, with consistent with an illustrative embodiment.

FIG. 19 is an illustration of a circuit carrier package including a smart chip, optical I/O and stackable modular battery in series, consistent with an illustrative embodiment. In this illustrated embodiment, the top side of battery 215 is unbonded (open) and on the bottom side, the common pads and cathode pads are shorted. The isolated common pads of the battery 215 are C4 bonded after a 180 degree rotation in the X-Y plane of battery 215.

Example Processes

With the foregoing overview of the various examples of energy storage devices and integrated circuit carrier packages, it may be helpful now to consider a high-level discussion of example processes of battery assembly. To that end, illustrative processes related to various aspects of a battery assembly method are illustrated as a collection of blocks in a logical flowchart, which represent sequence of operations.

Figure 20:
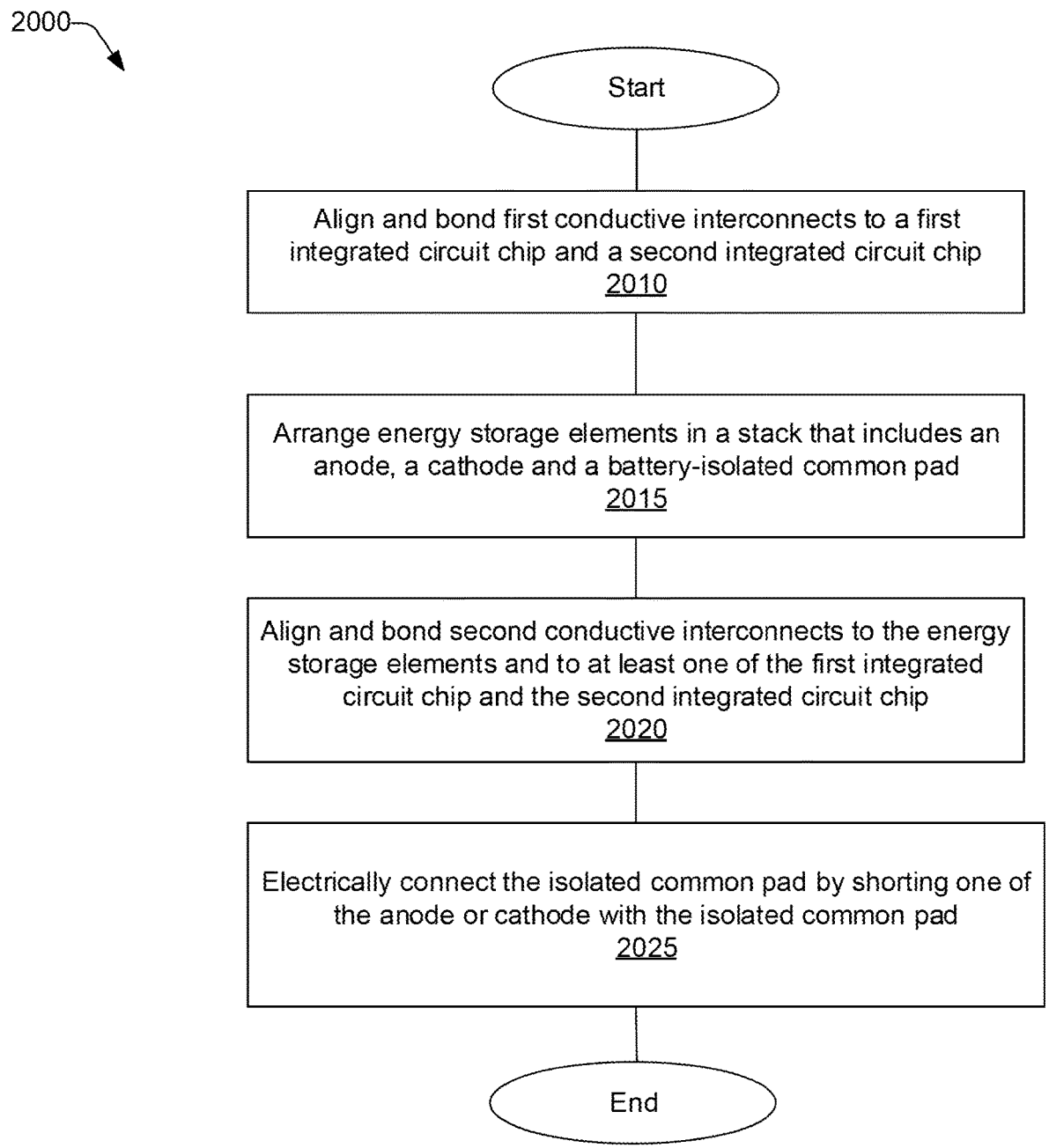
FIG. 20 is a flowchart showing operations of a battery assembly process and method.

FIG. 20 is a flowchart showing an overview of operations of a battery assembly process and a method for an integrated circuit carrier package. At operation 2010, first conductive interconnect elements are aligned and bonded to a first integrated circuit chip and a second integrated circuit chip. The first integrated circuit chip can be a smart chip as shown and described herein. The second integrated chip can be realized as an Optical I/O module, or an RF I/O module. The bonding may be C4 flip-chip bonding to the carrier substrate, although the method is not limited to this particular type of bonding.

At operation 2015, energy storage elements (e.g., solid state batteries or super caps) are arranged in a stack. For example, in a case where the energy storage elements are solid state batteries, stacking may be facilitated by symmetrically arranging contacts elements such as anodes and cathodes symmetrically to the surface of the batteries. For example, as previously shown, the anodes and cathodes may be arranged at a perimeter of the batteries. A battery-isolated common pad is also arranged on the batteries, thus creating three terminal batteries.

At operation 2020, second conductive elements are aligned and bonded to the energy storage elements and to the carrier substrate which contains at least one of the first integrated circuit chip and the second integrated circuit chip. The bonding may be performed by C4 flip-chip bonding.

At operation 2025, the isolated common pad can be electrically connected to the anode or the cathode by shorting the anode or the cathode with the isolated common pad. The use of the isolated common pad facilitates customizable battery stacking arrangements in various planes (Z plane, a 180 degree rotation in the X-Y plane, or a 180 degree rotation in the Y-Z plane), as needed. As the current and voltage requirements may vary in different carrier packages, the modular batteries of the present disclosure permit different arrangements of stackable batteries without the need for customized energy storage elements.

Figure 21:
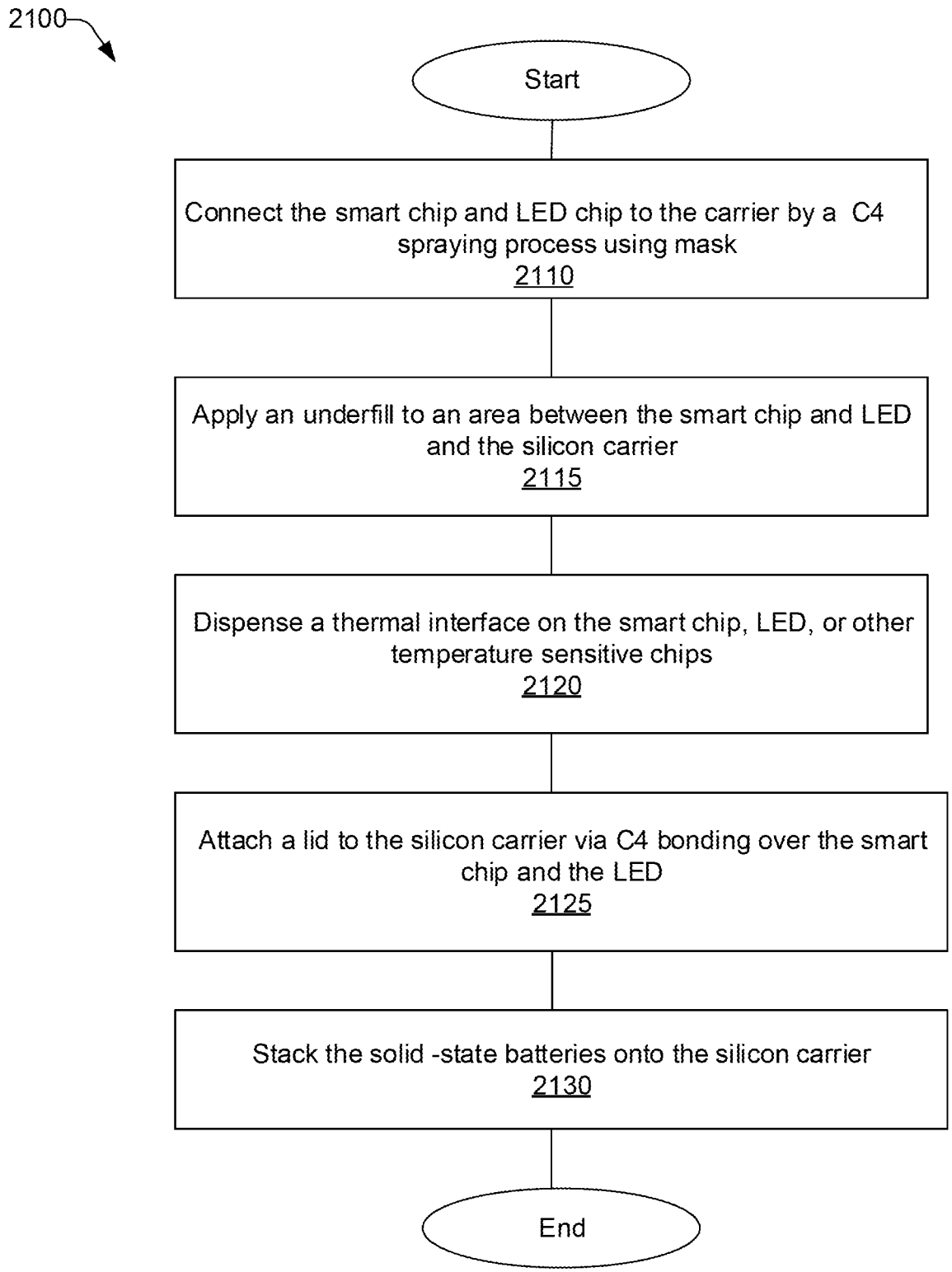
FIG. 21 is a flowchart providing an overview of a first level interconnect build and assembly of the carrier, and the assembly of a micro-battery onto the first level package, consistent with an illustrative embodiment.

FIG. 21 is a flowchart providing an overview of a first level interconnect build and assembly of the carrier, and the assembly of a micro-battery onto the first level package, consistent with an illustrative embodiment. At operation 2110, a smart chip and an LED are connected to a silicon carrier by C4 flip-chip bonding. The C4 bonding is performed by a no-clean solder flux spraying process using a mask followed by a temperature ramp profile suited to the C4 metallurgy.

At operation 2115, a mechanical strengthening underfill is applied to an area between the smart chip and the silicon carrier and between the LED and the silicon carrier. FIG. 17 is one example of the underfill material arranged as disclosed in operation 2115. It is to be understood that if the LED projects in a backside emitting direction (as shown for example in FIG. 10 where there is a space in the silicon carrier), the underfill may be of transparent index matching type or not used between the LED and the silicon carrier. In a non-limiting example, the underfill may be oven cured at 150° C. for about two hours.

At operation 2120, a thermal interface material is dispensed on at least one of the smart chip, or other temperature sensitive chips, and in contact with a thermally conducting lid if the next step 2125. When thermal dissipation from chips is not a priority, other types of lower cost lids may be used, for example, the "glob-top," shown in FIG. 13 but offer an environmental seal to protect the smart chip 355.

At operation 2125, a protective lid is attached to the silicon carrier so as to be arranged to cover the smart chip and the LED. The protective lid may be attached by C4 bonding to the carrier At operation 2130, the solid state batteries may be stacked and attached to the silicon carrier. As shown in FIG. 4, for example, the batteries 115, 215, 315 are stacked below the silicon carrier 385. However, the batteries can be stacked above the silicon carrier, and as discussed herein above, can be stacked vertically in a Z-plane, with or without a 180 degree rotation in the X-Y plane, or a 180 degree rotation in the Y-Z plane.

It is to be understood that the processes disclosed in FIG. 20 and FIG. 21 are provided for illustrative purposes and the disclosure is not limited to the operations in these figures.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings. For example, while the illustrative embodiments herein are shown and described with a silicon carrier, the present disclosure is not limited to a silicon carrier. The contact elements may include lands, pads, grooves, pins, sockets, organic laminates, ceramics, etc., just to name a few non-limiting examples. Contact materials may include one or more metallic or non-metallic electrically conductive materials, including but not limited to copper, copper, tin, aluminum, conductive polymers or other conductive metals. Doubly redundant interconnects increase reliability and may increase performance, but the present disclosure is not limited to such construction. The batteries may be connected in series or parallel by masking/unmasking battery contacts and/or by C4 bonding, or not bonding pads. The batteries may have a solid state form factor matched to the protective lid/electrical flexible cable.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

The flowchart, and diagrams in the figures herein illustrate the architecture, functionality, and operation of possible implementations according to various embodiments of the present disclosure.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher-level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications, such as toys, to advanced computer products having a display, a keyboard or other input device, and a central processor.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, the inventive subject matter lies in less than all features of a single disclosed embodiment. Thus, the following claims are hereby incorporated into the Detailed Description, with each claim standing on its own as a separately claimed subject matter.

What is claimed is:

1. An energy storage device, comprising:
   an energy storage element having contact elements arranged thereon including an anode pad, a cathode pad, and at least one isolated common pad;
   wherein the energy storage element is configured for stacking by symmetrically arranging the anode pad, cathode pad and the isolated common pad along a perimeter of the energy storage element and by shorting the isolated common pad to one of the anode or the cathode by bonded conductive interconnects.

2. The energy storage device according to claim 1, wherein the energy storage element comprises a plurality of energy storage elements arranged in a stack and bonded to the conductive interconnects by a controlled collapse chip connection (C4) bond.

3. The energy storage device according to claim 2, wherein the contact elements of the plurality of storage elements are arranged in one of a series or a parallel electrical connection.

4. The energy storage device according to claim 2, wherein the plurality of energy storage elements comprise a plurality of solid-state batteries.

5. The energy storage device according to claim 2, wherein the plurality of energy storage elements comprise a plurality of supercaps.

6. The energy storage device according to claim 2, wherein the plurality of energy storage elements are stacked vertically in a Z-plane by C4 bonding.

7. The energy storage device according to claim 2, wherein the plurality of energy elements are stacked in at least one 180 degree rotation of an X-Y plane or an X-Z plane by C4 bonding.

8. A integrated circuit carrier package, comprising:
   a silicon carrier;
   a smart chip electrically connected to the silicon carrier;
   an I/O device electrically connected to the silicon carrier;
   a plurality of aligned and bonded energy storage elements, including at least one pass-through isolated connection to the smart chip and the I/O device, and contact elements arranged on each of the storage elements comprising an anode, a cathode, and an isolated common pad; and
   a multi-signal electrical flexible cable arranged to connect the silicon carrier and the respective anode and the cathode of each the plurality of energy storage elements,
   wherein the plurality of energy storage elements are arranged in a stack in which the isolated common pad is connected to the multi-signal electrical flexible cable and shorted to one of the anode or the cathode by bonded conductive interconnects.

9. The integrated circuit carrier package according to claim 8, wherein the smart chip is hermetically sealed, and the stack of the energy storage elements is modular.

10. The integrated circuit carrier package according to claim 9, wherein the energy storage elements are connected electrically in parallel or series, and connections of conductive interconnects of the energy storage elements to the electrical flexible are selectively configurable to the electrical flexible to vary a current or voltage.

11. The integrated circuit carrier package according to claim 8, wherein the bonded conductive interconnects comprise a controlled collapse chip connection (C4) bond.

12. The integrated circuit carrier package according to claim 8, wherein the energy storage elements comprise solid-state batteries or solid-state supercaps.

13. The integrated circuit carrier package according to claim 8, wherein the I/O device comprises at least one of an optical I/O device or an RF I/O device.

14. The integrated circuit carrier package according to claim 8, further comprising photovoltaics for optical energy harvesting or an antenna configured for RF energy harvesting.

15. The integrated circuit carrier package according to claim 8, further comprising a package lid arranged over a least a portion of a circuit side of the silicon carrier.

16. The integrated circuit carrier package according to claim 8, wherein the energy storage elements further comprise doubly redundant anodes and cathodes.

17. A method of multichip assembly, the method comprising:
   aligning and bonding a plurality of first conductive interconnects to at least a first integrated circuit chip and a second integrated circuit chip;
   arranging a plurality of energy storage elements in a stack,
   aligning and bonding a plurality of second conductive interconnects to the plurality of energy storage elements and to at least one of the first integrated circuit chip and the second integrated circuit chip, wherein the plurality of energy storage elements include an anode, a cathode, and an isolated common pad; and
   electrically connecting the isolated common pad cable by shorting one of the anode or the cathode with the isolated common pad.

18. The method according to claim 17, further comprising:
   electrically connecting a multi-signal electrical flexible cable to the anode and cathode to the plurality of energy storage elements, respectively; and
   wherein the first conductive interconnects and the second conductive interconnects are bonded to the energy storage elements by a controlled collapse chip connection (C4) bond.

19. The method according to claim 17, wherein the first conductive interconnect and the second conductive interconnects have a substantially similar pitch between the first integrated circuit chip and the second integrated circuit chip.

20. The method according to claim 17, wherein the first integrated circuit chip comprises a smart chip, and the second integrated circuit chip comprises an I/O chip.

* * * * *